US012793758B2

(12) United States Patent
Ayyapureddi

(10) Patent No.: US 12,793,758 B2
(45) Date of Patent: Nov. 10, 2026

(54) FAST BACKGROUND ARRAY PATTERN WRITING

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 18/678,630

(22) Filed: May 30, 2024

(65) Prior Publication Data

US 2024/0404574 A1 Dec. 5, 2024

Related U.S. Application Data

(60) Provisional application No. 63/469,713, filed on May 30, 2023.

(51) Int. Cl.

| | |
|---|---|
| ***G11C 16/10*** | (2006.01) |
| ***G11C 11/00*** | (2006.01) |
| ***G11C 11/4072*** | (2006.01) |
| ***G11C 11/4078*** | (2006.01) |
| ***G11C 16/20*** | (2006.01) |
| ***G11C 16/22*** | (2006.01) |

(52) U.S. Cl.

CPC ........ *G11C 11/005* (2013.01); *G11C 11/4072* (2013.01); *G11C 11/4078* (2013.01); *G11C 16/20* (2013.01); *G11C 16/22* (2013.01)

(58) Field of Classification Search

CPC .............. G11C 11/005; G11C 11/4072; G11C 11/4078; G11C 16/20; G11C 16/22

See application file for complete search history.

(56) References Cited

U.S. PATENT DOCUMENTS

| | | | | |
|---|---|---|---|---|
| 2003/0123317 | A1* | 7/2003 | Fujino | G11C 11/4076 365/230.06 |
| 2015/0003151 | A1* | 1/2015 | Lee | G11C 11/5628 365/185.02 |
| 2015/0085580 | A1* | 3/2015 | Wang | G11C 7/1096 365/185.18 |
| 2015/0234707 | A1* | 8/2015 | Vogelsang | G11C 29/50016 714/764 |
| 2016/0172028 | A1* | 6/2016 | Park | G11C 11/2255 365/148 |
| 2017/0069358 | A1* | 3/2017 | Yun | G11C 29/50012 |
| 2018/0204620 | A1* | 7/2018 | Kim | G11C 16/20 |

* cited by examiner

*Primary Examiner* — Min Huang

(74) *Attorney, Agent, or Firm* — Schwegman Lundberg & Woessner, P.A.

(57) ABSTRACT

To ensure proper functioning of a memory component, the memory cells may be initialized to a known value before the memory device is used. The known values are termed the "background pattern." The memory cells may also be reset to the background pattern to scrub data memory for security. Typically, standard write operations are used to write the background pattern. As discussed herein, multiple addresses on a single word line can be written to simultaneously. As also discussed herein, when the same data is written to multiple word lines, the step of copying the data to the sense amplifiers may be performed once instead of repeated for each write command, further reducing the time consumed by writing background patterns to a memory array.

19 Claims, 8 Drawing Sheets

FAST BACKGROUND ARRAY PATTERN WRITING

PRIORITY APPLICATION

This application claims the benefit of priority to U.S. Provisional Application Ser. No. 63/469,713, filed May 30, 2023, which is incorporated herein by reference in its entirety.

TECHNICAL FIELD

The present disclosure generally relates to memory sub-systems and, more specifically, to writing array patterns in memory sub-systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

During memory initialization, it may be desirable to set all memory in a memory component to predetermined values before allowing the memory to be used by applications. The data may be initialized by using standard memory write commands to write a predetermined value, such as all zeros, to each memory location in the memory being initialized.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
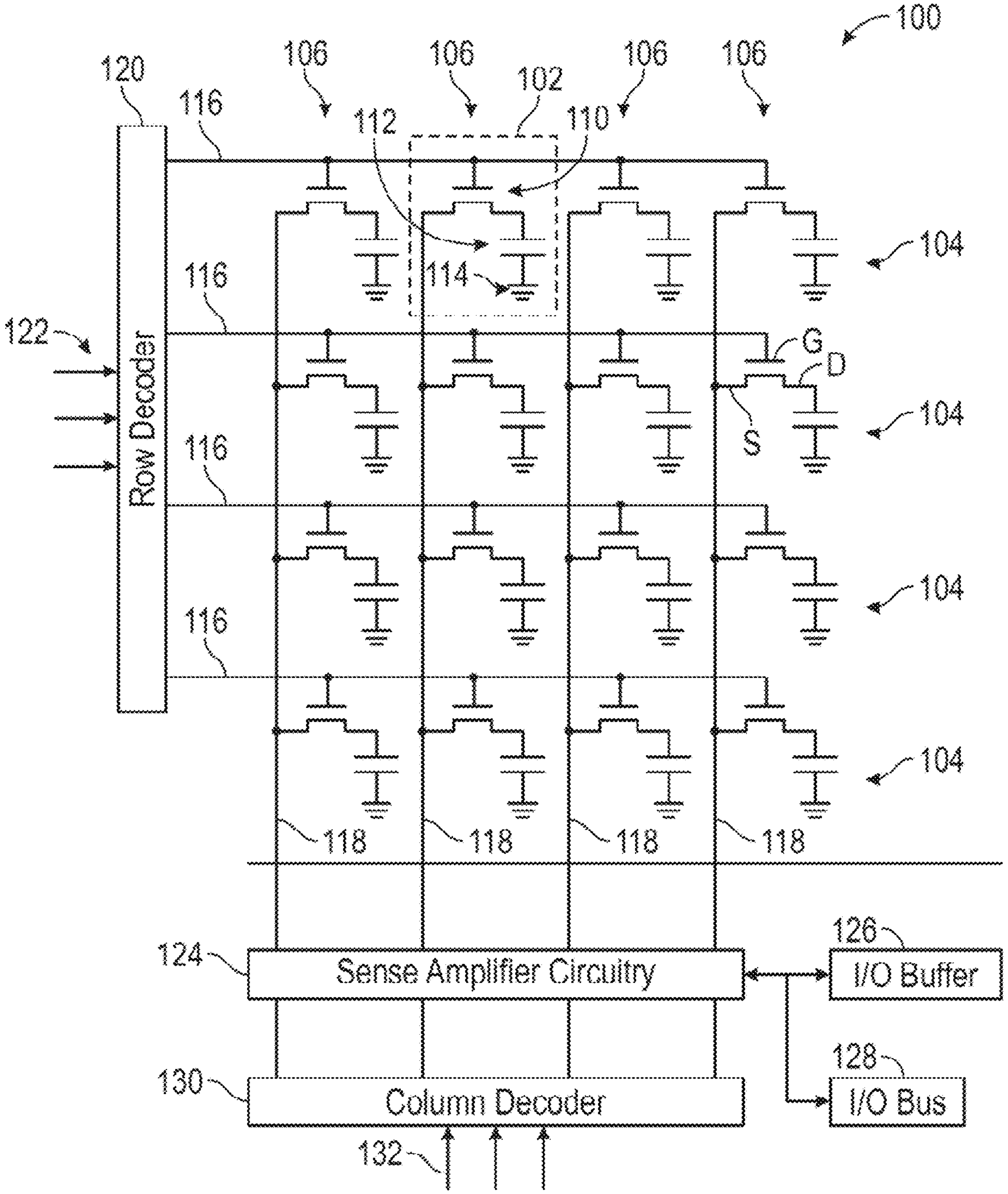
FIG. 1 is a schematic diagram of an example DRAM device according to various embodiments.

Aspects of the present disclosure are directed to a memory sub-system providing fast background memory array writing. A memory sub-system is also hereinafter referred to as a "memory system." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Different memory components can include different types of media. Examples of media include, but are not limited to, a cross-point array of non-volatile memory, flash-based memory cells, DRAM, SRAM, SDRAM, NAND memory, and NOR memory.

During a boot process, the data values represented by the uninitialized threshold voltages of memory cells are indeterminate. To ensure proper functioning of the memory component, the memory cells are initialized to a known value before the memory device is used. Thus, the amount of time taken to initialize memory is one component of the boot time of a computing device, and increasing the speed of memory initialization improves both the memory device and the functioning of the computing device using the memory device.

Background memory array patterns may also be used to scrub data memory for security. For example, when an application terminates, the memory that it used may still store confidential data. A malicious application may allocate memory and read data from the memory before writing data to the memory, thus accessing data from the terminated application. To avoid this, an application or operating system may scrub the used memory by writing a background memory array pattern to the used memory before allowing another application to use the same memory.

Typically, standard write operations are used to initialize the memory. For example, a central processing unit (CPU) may send write commands to the memory device addressed to every physical address, causing the memory device to initialize the memory. With each write command, data provided by the CPU is copied to sense amplifiers (or signal drivers) in the memory device and then the sense amplifiers provide programming signals to program the addressed memory cells. As discussed herein, multiple addresses (e.g., 16 addresses) on a single word line can be written to simultaneously, reducing the write time by a corresponding factor (e.g., improving the write time by a factor of 16). As also discussed herein, when the same data is written to cells corresponding to respective multiple word lines, the step of copying the data from the CPU to the sense amplifiers may be performed once instead of repeated for each write command, further reducing the time consumed by writing background patterns to a memory array.

FIG. 1 provides a schematic of an example DRAM device 100 according to various embodiments. The device includes an array of memory cells 102 (only one being labeled in FIG. 1 to avoid obfuscation) arranged in rows 104 and columns 106. For simplicity, and sufficiently for purposes of explaining fundamental components and the basic operation of the memory device 100, the array is shown in only two dimensions; the array can be extended into the third dimension. Further, while only four rows 104 and columns 106 are illustrated, it is to be understood that DRAM devices can, in practice, include many more (e.g., tens, hundreds, or thousands of) memory cells 102 per row and/or per column.

In accordance with various embodiments, each memory cell 102 includes a single transistor 110 (e.g., a field effect transistor (FET)) and a single capacitor 112; such a cell is, therefore, also commonly referred to as a 1TIC cell. One plate of the capacitor 112, herein also the "node plate," is connected to the drain terminal ("D") of the transistor 110, whereas the other plate of the capacitor 112 is connected to a cell plate 114. The cell plate 114 may be maintained at a predetermined voltage level (e.g., one half of Vec, where Vcc is the operating voltage of the memory device). Each capacitor 112 within the array of 1TIC cells 102 serves to store one bit of data, and the respective transistor 110 serves as an "access device" to write to or read from the storage capacitor 112.

The transistor gate terminal terminals ("G") within each row 104 are portions of respective access lines (alternatively referred to as "word lines") 116 (and may be formed of the same material, or a different material), and the transistor source terminals ("S") within each column 106 are electrically connected to respective data lines (alternatively referred to as "bit lines") 118. A row decoder 120 can selectively drive the individual access lines 116, responsive to row address signals 122 input to the row decoder 120. Driving a given access line 116 at a high voltage causes the access transistors 110 within the respective row 104 to conduct, thereby connecting the storage capacitors 112 within the row 104 to the respective data lines 118, such that charge can be transferred between the data lines 118 and the storage capacitors 112 as required for read or write operations. Both read and write operations can be performed via sense amplifier circuitry 124, which can transfer bit values between the memory cells 102 of the selected row 104 and input/output buffers 126 (for write/read operations) or external input/output data buses 128. A column decoder 130 responsive to column address signals 132 can select which of the memory cells 102 within the selected row 104 is read out or written to. Alternatively, for read operations, the storage capacitors 112 within the row 104 may be read out simultaneously and latched, and the column decoder 130 can then select which latch bits to connect to the output data bus 128. Since read-out of the storage capacitors destroys the stored information, the read operation is accompanied by a simultaneous rewrite of the capacitor charge. Further, in between read/write operations, the capacitor charge is repeatedly refreshed to prevent data loss.

In a typical data write operation, an incoming write command includes an address and a data value. The inputs to the row decoder 120 and the column decoder 130 are determined by the address, in the form of column address signals 132 and row address signals 122. The data value is input to the memory cells through the I/O buffer 126 or the I/O bus 128 and provided to the memory cells via the sense amplifier circuitry 124. After the data value is written to the addressed memory, the write operation is complete and an acknowledgement may be sent via the I/O bus 128. If the same data value is to be written to multiple addresses, the data is resent along with the updated address and the process is repeated.

As disclosed herein, writing the same data value to multiple addresses may be performed more quickly by setting the bits in the sense amplifier circuitry 124 once and changing the activated bit lines 118, the activated word lines 116, or both to write the data to multiple memory cells. For example, the data values in the sense amplifier circuitry 124 may be set to logical zero values and the word lines 116 and the bit lines 118 iterated over (one at a time or in multiples) so that memory cells are programmed with the data values (logical zeros). The writing of the data to multiple word lines and bit lines may be performed in response to a single command, avoiding delays associated with receiving instructions over the I/O bus 128. The data values can be written to the sense amplifier circuitry 124 only once, reducing delays associated with loading data to the sense amplifier circuitry 124 from the I/O buffer 126 or the I/O bus 128. In an example, writing data includes pre-charging one or more word lines 116. Typically, only the word line 116 indicated by the row decoder 120 is pre-charged. Thus, writing to multiple word lines with sequential write commands involves sequential charging of word lines. Pre-charging multiple word lines 116 simultaneously may further reduce the time to write the memory values to the memory array.

An access line 116 may be driven at a higher voltage than the voltage of the address signals 122 received by the row decoder 120. Accordingly, a voltage level shifter may be used to convert the address signal from a first power domain to a second power domain. The use of a transition time reduction circuit, as described herein, may improve the responsiveness of the memory device 100, reduce the power consumption of the memory device 100, allow the memory device 100 to have a higher operating frequency, increase the rate of memory access from the memory device 100, or any suitable combination thereof.

The memory device 100 may be implemented as an integrated circuit within a package that includes pins for receiving supply voltages (e.g., to provide the source and gate voltages for the transistors 110) and signals (including data, address, and control signals). In general, it is to be understood that FIG. 1 depicts memory device 100 in drastically simplified form to illustrate basic structural components and principles of operation, omitting many details of the memory cells 102 and associated access and data lines 116, 118 as well as the peripheral circuitry. For example, in addition to the row and column decoders 120, 130, sense amplifier circuitry 124, and buffers 126, the memory device 100 may include further peripheral circuitry, such as a memory control unit that controls the memory operations based on control signals (provided, e.g., by an external processor), additional input/output circuitry, etc. Details of such peripheral circuitry are not further discussed herein. Instead, the following description focuses on structural details of the memory cells 102 and layout of the memory cell array in accordance with various embodiments.

In 2 D DRAM arrays, the rows 104 and columns 106 of memory cells 102 are arranged along a single horizontal plane (i.e., a plane parallel to the layers) of the semiconductor substrate, e.g., in a rectangular lattice with mutually perpendicular horizontal access and data lines 116, 118. In 3 D DRAM arrays, the memory cells 102 are arranged in a 3 D lattice that encompasses multiple vertically stacked horizontal planes corresponding to multiple device tiers of a multi-tier substrate assembly, with each device tier including multiple parallel rows of cells 102 whose transistor gate terminals are connected by horizontal access lines 116. (A "device tier," as used herein, may include multiple layers (or levels) of materials, but forms the components of memory devices of a single horizontal tier of memory cells.) The data lines 118 extend vertically through all or at least a vertical portion of the multi-tier structure, and each data line 118 connects to the transistor source terminals of a vertical column 106 of associated memory cells 102 at the multiple device tiers. This 3 D configuration of memory cells enables further increases in bit density compared with 2 D arrays.

Figure 2:
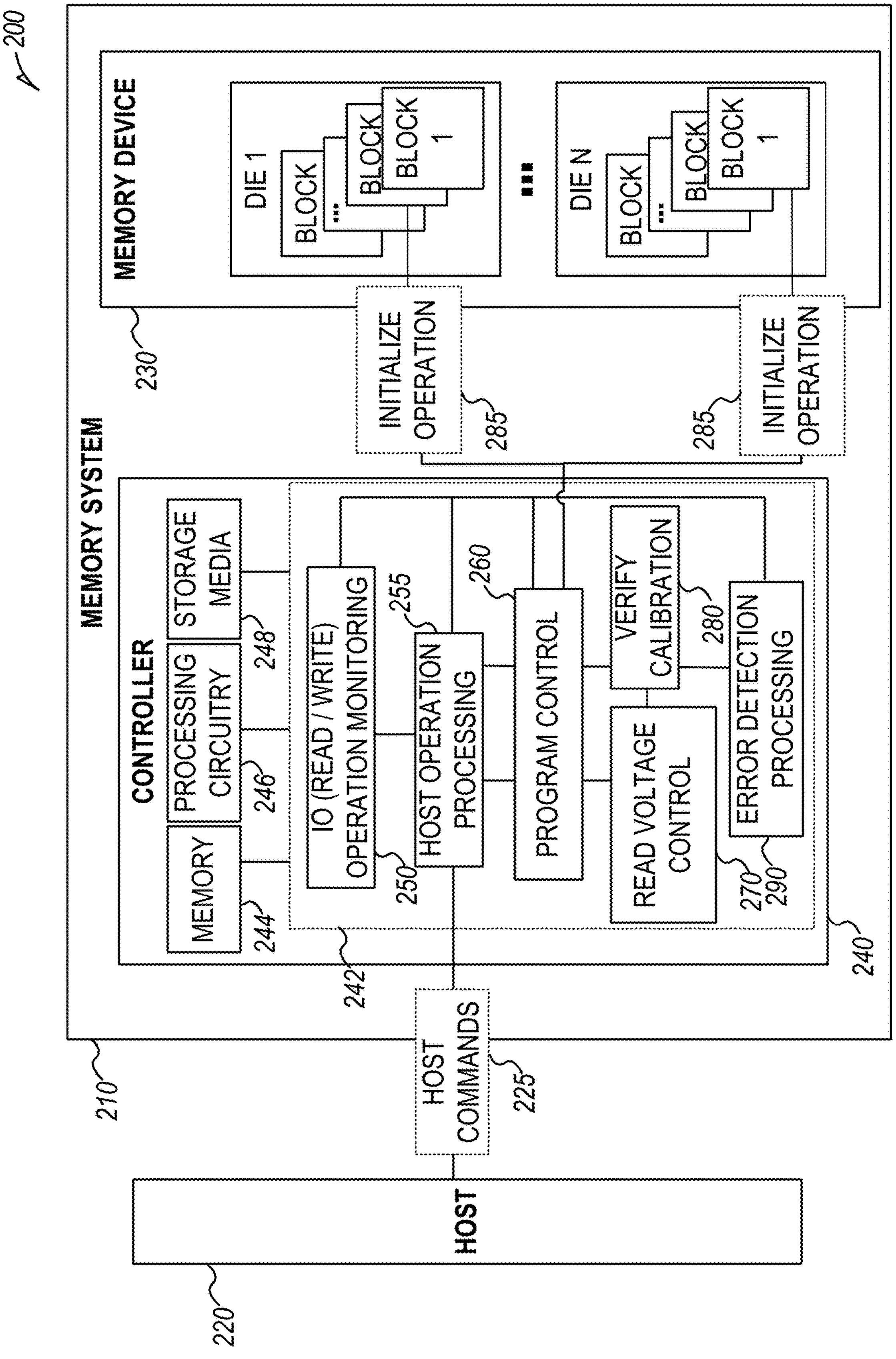
FIG. 2 is a block diagram of an example system including a memory device adapted for writing background array patterns quickly.

FIG. 2 provides a block diagram of an example system 200 including a memory system 210 (e.g., a SSD storage device, a SD/MMC card, etc.) having a memory controller 240 and a memory device 230. In an example, the functionality of control modules 242 of the memory controller 240 may be implemented in respective modules in a firmware of the memory controller 240. However, it will be understood that various forms of software, firmware, and hardware may be utilized by the controller 240 to implement the control modules 242 (e.g., implement the functionality of program control 260) and the other techniques discussed herein.

As shown, the memory system 210 includes a NAND memory device 230 with multiple dies (dies 1-N), with each die including one or more blocks (blocks 1-N). Each of the one or more blocks may include further divided portions, such as one or more word lines (not shown) per block; and each of the one or more word lines may be further comprised of one or more pages (not shown) per word line, depending on the number of data states that the memory cells of that word line are configured to store.

Accessing data from the memory device 230 may comprise applying a read voltage to a word line, wherein the voltage applied to the word line is different than the signaling voltage used to indicate that the voltage should be applied. A voltage level shifter may be used to convert the signaling voltage in a first power domain to the read voltage in a second power domain. By using the transition time reduction techniques and circuits discussed herein, the transition time for applying or ceasing to apply the read voltage may be reduced, improving performance of the memory device 230 by reducing power consumption, increasing operating frequency, or both.

In an example, the blocks of memory cells of the memory device 230 include groups of at least one of: single-level cell (SLC), multi-layer cell (MLC), triple-layer cell (TLC), or quad-layer cell (QLC) NAND memory cells. Also, in an example, the memory device 230 is arranged into a stack of three-dimensional (3 D) NAND dies. These configurations and further detailed components of the memory device 230 are not illustrated in FIG. 2 for simplicity. However, the memory device 230 may incorporate these or any of the features described above with reference to features of 3 D NAND architecture devices or other forms of NAND storage devices.

In 3 D architecture semiconductor memory technology, vertical structures are stacked, increasing the number of tiers, physical pages, and accordingly, the density of a memory device (e.g., a storage device). In an example, the memory system 210 can be a discrete memory or storage device component of the host device 220. In other examples, the memory system 210 can be a portion of an integrated circuit (e.g., system on a chip (SOC), etc.), stacked or otherwise included with one or more other components of the host device 220.

Each flash memory cell in a NAND architecture semiconductor memory array may be programmed to two or more programmed states. For example, an SLC may represent one of two programmed states (e.g., 1 or 0), representing one bit of data. Flash memory cells may also represent more than two programmed states, allowing the manufacture of higher density memories without increasing the number of memory cells, as each cell may represent more than one binary digit (e.g., more than one bit). Such cells may be referred to as multi-state memory cells, multi-digit cells, or multi-level cells (MLCs). In certain examples, MLC may refer to a memory cell that may store two bits of data per cell (e.g., one of four programmed states), TLC may refer to a memory cell that may store three bits of data per cell (e.g., one of eight programmed states), and a QLC may store four bits of data per cell. MLC is used herein in its broader context to refer to any memory cell(s) that may store more than one bit of data per cell (i.e., that may represent more than two programmed states; thus, the term MLC is used herein in the broader context to be generic to memory cells storing 2, 3, 4, or more bits of data per cell).

The memory system 210 is shown as being operably coupled to a host device 220 via a controller 240 of the memory device. The controller 240 is adapted to receive and process host IO commands 225, such as read commands, write commands, erase commands, and the like, to read, write, erase, and manage data stored within the memory device 230. In other examples, the memory controller 240 may be physically separate from an individual memory device, and may receive and process commands for one or more individual memory devices. A variety of other components for the memory system 210 (such as a memory manager, and other circuitry or operational components) and the controller 240 are also not depicted for simplicity.

The controller 240 is depicted as including a memory 244 (e.g., volatile memory), processing circuitry 246 (e.g., a microprocessor), and a storage media 248 (e.g., non-volatile memory), used for executing instructions (e.g., instructions hosted by the storage media 248, loaded into memory 244, and executed by the processing circuitry 246) to implement the control modules 242 for management and use of the memory device 230. The functionality provided by the control modules 242 may include, but is not limited to: IO operation monitoring 250 (e.g., to monitor read and write IO operations, originating from host commands); host operation processing 255 (e.g., to interpret and process the host IO commands 225, and to issue further commands to the NAND memory device 230 to perform respective read, write, erase, or other host-initiated operations); program control 260 (e.g., to control the timing, criteria, conditions, and parameters of respective initialize operations 285 on the memory device 230); read voltage control 270 (e.g., to establish, set, and utilize a program voltage level to read a particular portion of the memory device 230); verify calibration 280 (e.g., to operate a calibration procedure to identify a new programmed voltage level of a particular portion or portions of the memory device 230); and error detection processing 290 (e.g., to identify and correct errors from data obtained in read operations, to identify one or more raw bit error rates (RBER(s)) for a particular read operation or set of operations, etc.).

One or more communication interfaces can be used to transfer the host IO commands 225 between the memory system 210 and one or more other components of the host device 220, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 220 can include a host system, an electronic device, a processor, a memory card reader, or one or more other electronic devices external to the memory system 210. In some examples, the host device 220 may be a machine having some portion, or all, of the components discussed in reference to the machine 800 of FIG. 8.

In an example, the host operation processing 255 is used to interpret and process the host IO commands 225 (e.g., read and write commands) and initiate accompanying commands in the controller 240 and the memory device 230 to accomplish the host IO commands 225. Further, the host operation processing 255 may coordinate timing, conditions, and parameters of the program control 260 in response to the host IO commands 225, IO operation monitoring 250, and error detection processing 290.

The IO operation monitoring 250 operates, in some example embodiments, to track reads and writes to the memory device 230 initiated by host IO commands. The IO operation monitoring 250 also operates to track accompanying IO operations and states, such as a host IO active or inactive state (e.g., where an active state corresponds to the state of the controller 240 and memory device 230 actively performing read or write IO operations initiated from the host device 220, and where an inactive state corresponds to an absence of performing such IO operations initiated from the host device 220). The IO operation monitoring 250 may also monitor voltage level and read error rates occurring with the IO operations initiated from the host device 220, in connection with determining parameters for the program control 260 as discussed herein.

The program control 260 can include, among other things, circuitry or components (hardware and/or software) configured to control memory operations associated with writing data to, reading data from, or erasing one or more memory cells of the memory device 230 coupled to the memory controller 240, including writing background data patterns to the memory cells of the memory device 230. In an example, the program control 260 operates to identify parameters in the memory device 230 and controller 240 for scheduling and conducting an initialize operation 285, such as based on the IO conditions (e.g., indicated by the IO operation monitoring 250), error conditions (e.g., indicated by the error detection processing 290), or boot conditions (e.g., during device startup).

The read voltage control 270, in some example embodiments, is used to establish, change, and provide a voltage value used to read a particular area of memory (such as a respective block in the memory device 230). For example, the read voltage control 270 may implement various positive or negative offsets in order to read respective memory cells and memory locations (e.g., pages, blocks, dies) including the respective memory cells. A voltage level shifter may be used to transition control signals from a first power domain to control signals in a second power domain. The operating voltage of the second power domain may be controlled by the read voltage control 270. For example, a common ground may be used in the two power domains, a fixed voltage source used as the operating voltage of the first power domain, and the output of a voltage source, configured by the read voltage control 270, used as the operating voltage of the second power domain.

In an example, the verify calibration 280 is used to establish (e.g., change, update, reset, etc.) whether or not a verify operation should be performed after a program operation. The verify calibration 280 may be implemented based on a number or percentage of bits in the NAND memory device 230 that were successfully programmed at a lower voltage level.

The error detection processing 290, in some example embodiments, may detect a recoverable error condition (e.g., a RBER value or an RBER trend), an unrecoverable error condition, or other measurements or error conditions for a memory cell, a group of cells, or larger areas of the memory array (e.g., averages or samples from a block, group of blocks, die, group of dies, etc.).

Additionally, the sampling and read operations that are performed in a read scan by the program control 260 may allow configuration, such as from a specification (e.g., a determined setting or calculation) of: a size of data (e.g., data corresponding to a page, block, group of blocks, die) that is programmed; a number of pages in total that are programmed; a number of pages within a block that are programmed; whether certain cells, pages, blocks, dies, or certain types of such cells, pages, blocks, dies are or are not programmed; and the like. Likewise, the program control 260 may control or allow configuration of the number of program cycles that are performed before the first verify cycle, the number of program cycles that are performed between verify cycles, the number of bits to be successfully programmed at each level before next-level verification begins, or any suitable combination thereof.

In addition to the techniques discussed herein, other types of maintenance operations may be implemented by the control modules 242 in the controller 240. Such operations may include garbage collection or reclamation, wear leveling, block management, and other forms of background activities performed upon the memory device 230. Such background activities may be triggered during an idle state detected by the IO operation monitoring 250, such as immediately following or concurrently with a read scan operation.

The program control 260 can include an error correction code (ECC) component, which can include, among other things, an ECC engine or other circuitry configured to detect or correct errors associated with writing data to or reading data from one or more memory cells of the memory device 230 coupled to the memory controller 240. The memory controller 240 can be configured to actively detect and recover from error occurrences (e.g., bit errors, operation errors, etc.) associated with various operations or storage of data, while maintaining integrity of the data transferred between the host device 220 and the memory system 210, or maintaining integrity of stored data (e.g., using redundant RAID storage, etc.), and can remove (e.g., retire) failing memory resources (e.g., memory cells, memory arrays, pages, blocks, etc.) to prevent future errors.

The memory device 230 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the memory system 210 in pages, and erased in blocks. However, one or more memory operations (e.g., read, write, erase, etc.) can be performed on larger or smaller groups of memory cells, as desired. The data transfer size of a NAND memory system 210 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory devices 230 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more meta-data bytes for error data than the corresponding SLC device.

Figure 3:
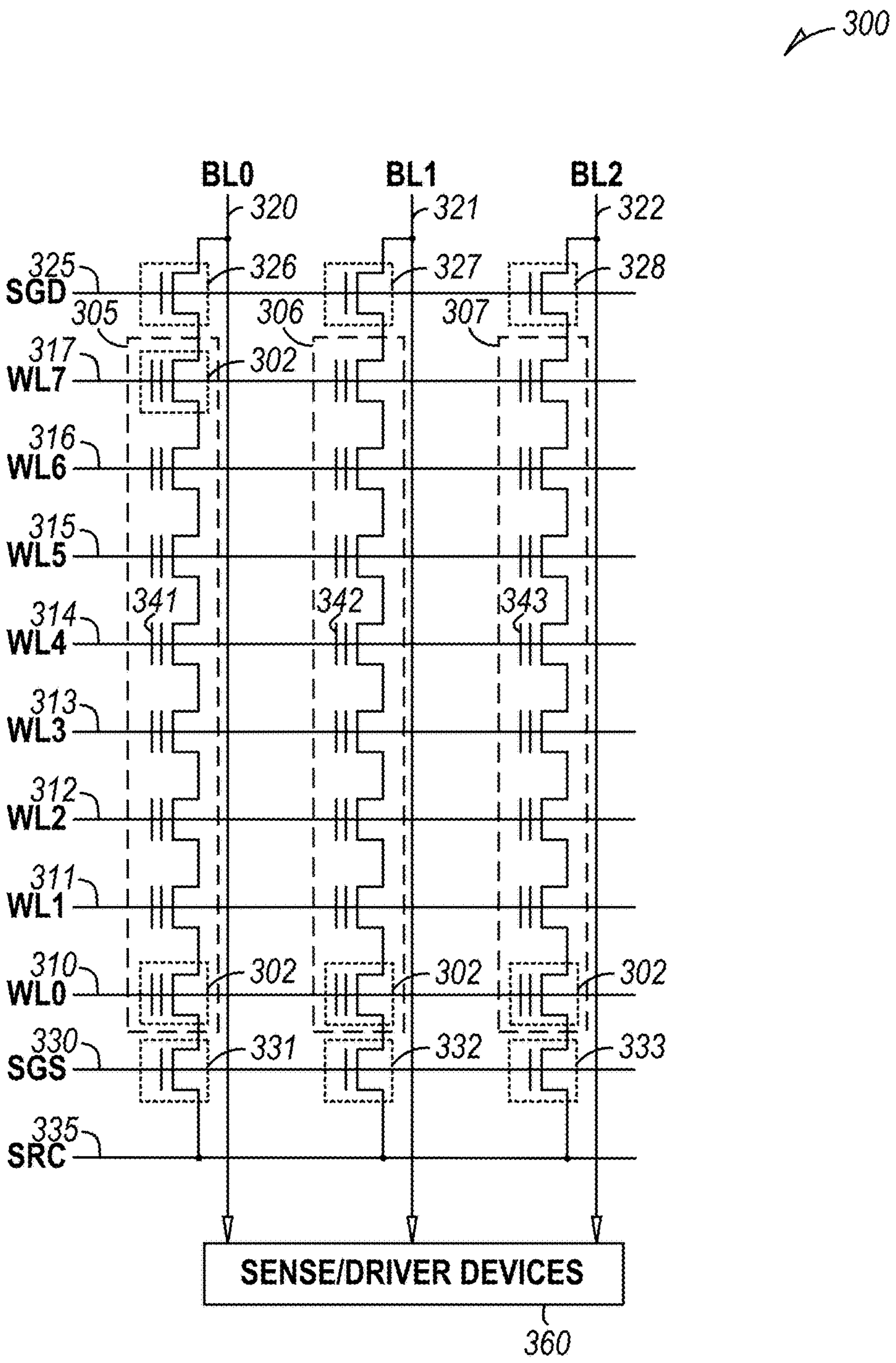
FIG. 3 illustrates a schematic diagram of an example of a NAND architecture semiconductor memory array.

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers/driver devices 360. For example, the memory array 300 can illustrate an example schematic diagram of a portion of one physical page of memory cells of a NAND or 3 D NAND architecture semiconductor memory device.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) 325 (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the charge storage elements of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the charge storage elements of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

As disclosed herein, multiple word lines, such as WL0, WL1, WL2, and WL3, may receive the programming voltage, causing the data in the sense/driver devices 360 to be simultaneously written to the data cells of the multiple word lines. As a result, the time taken to initialize the memory array 300 is reduced. Alternatively, a background pattern may be written to the memory cells by loading the sense amplifiers and iterating over the word lines to program the memory cells of each word line with the background pattern.

The sense/driver devices 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

A verify operation is performed by applying a verify voltage to the control gate of each transistor being verified, applying a bias voltage to the source line 335, and providing a sensing current (e.g., 3 μA) to each of the bit-lines 320-322. As a result, the gate-to-source voltage, Vgs, of each transistor equals the verify voltage minus the bias voltage and will turn on or conduct current only if the threshold voltage Vt of the transistor is less than or equal to Vgs. The verify voltage and bias voltage should be such that Vgs is at least equal to the desired threshold voltage. Determining if any current flows through the NAND string indicates whether or not all transistors have been properly programmed, i.e., each having threshold voltages greater than or equal to the desired threshold voltage.

Figure 4:
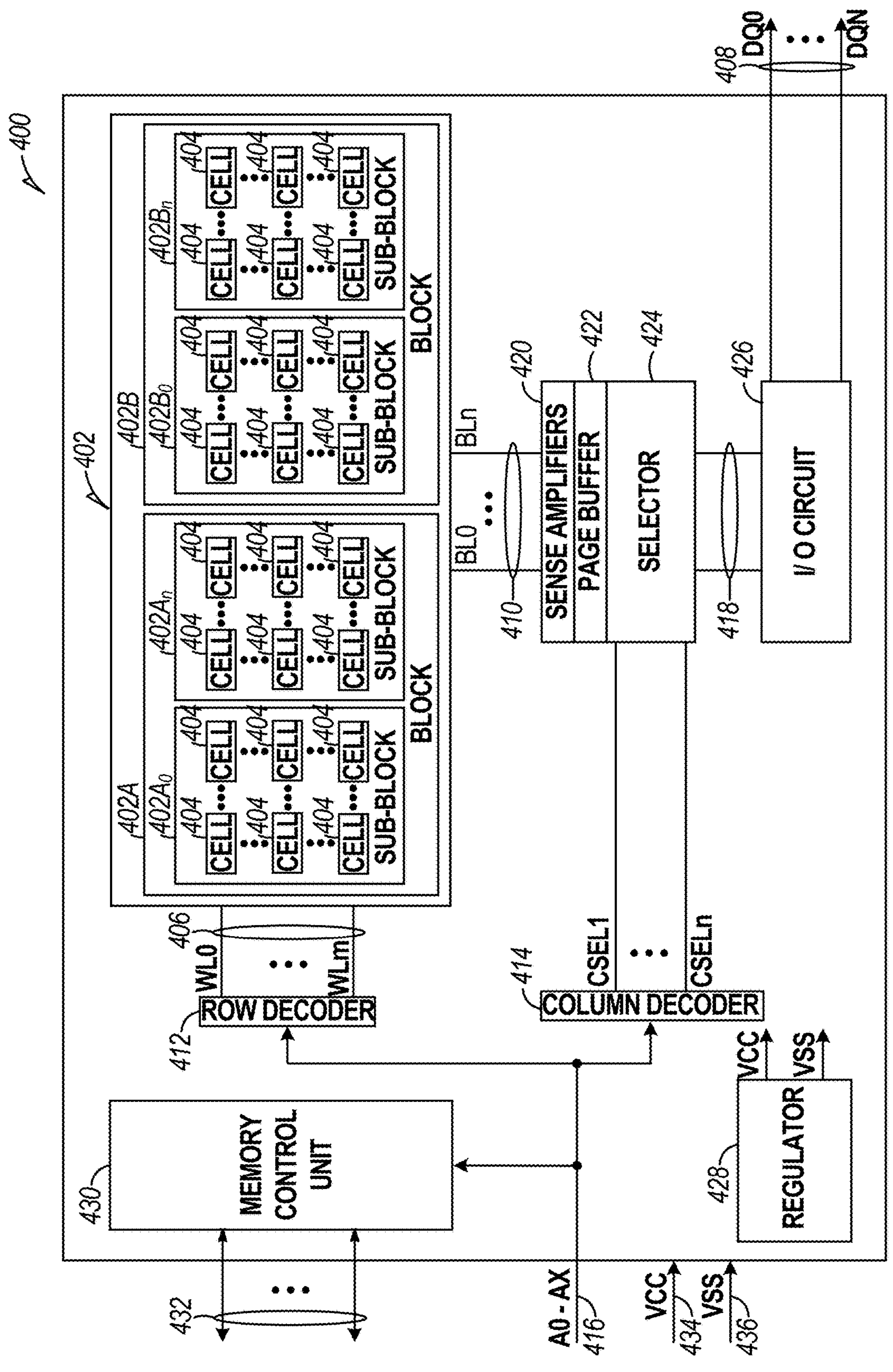
FIG. 4 illustrates an example block diagram of a memory device.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402$A_0$, 402$A_n$, and the second block 402B can include first and second sub-blocks 402$B_0$, 402$B_n$. Each sub-block can include a number of physical pages, each page including a number of memory cells 404. Although illustrated herein as having two blocks 402A, 402B, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line(s) 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

An instruction to write a background pattern to a portion of the memory may be received by the memory control unit 430. The background pattern may be loaded into the sense amplifiers 420 and written to multiple blocks or sub-blocks without receiving additional instructions.

Figure 5:
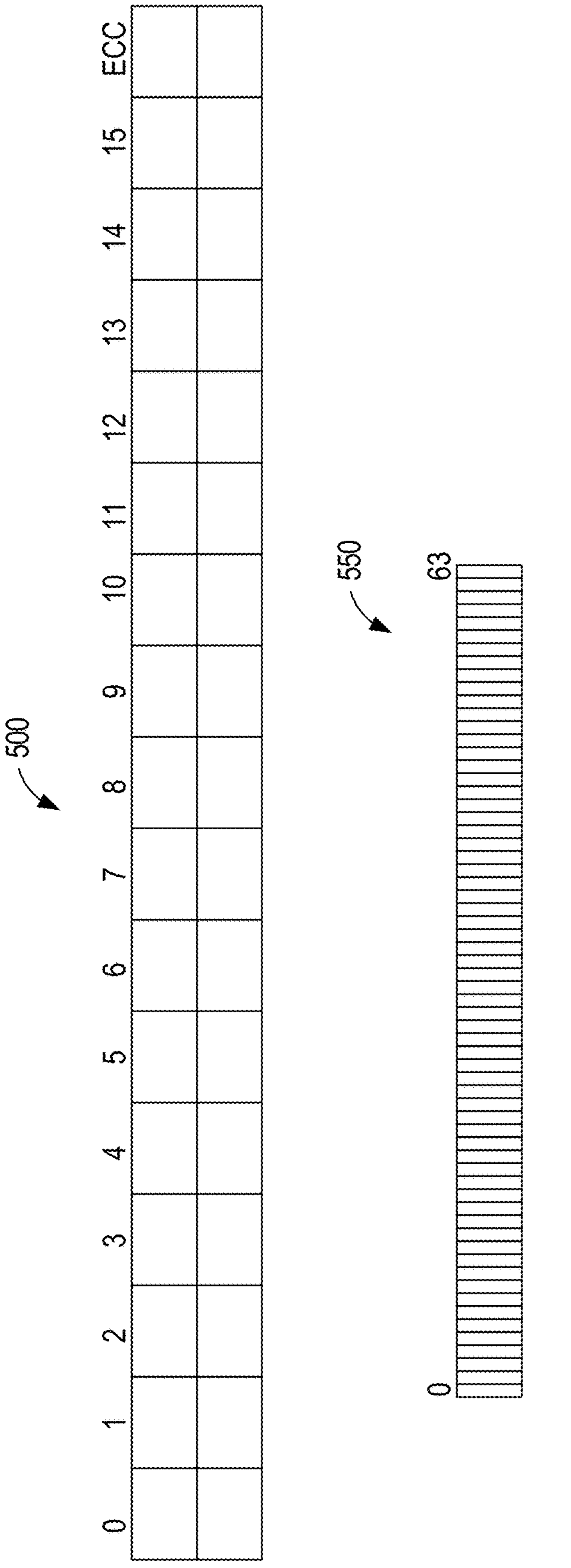
FIG. 5 is a schematic diagram showing the use of columns and column planes for accessing and modifying data in a semiconductor memory array.

FIG. 5 is a schematic diagram showing the use of columns and column planes for accessing and modifying data in a semiconductor memory array. Schematic diagram 500 shows a wordline divided into sixteen column planes and one ECC column plane. Each column plane may be divided into columns of one or more bits each (e.g., eight bits). Data is read from the memory array or written to the memory array when a word line and a column are both activated.

Each column plane may comprise one column for each of a plurality of column planes. Blow-up schematic diagram 550 shows that each data column plane comprises sixty-four columns. Thus, in this example, there are sixty-four columns. The width of the word line is 64 columns per block×16 column planes×8 bits per column=8,192 bits, plus 512 bits of ECC data. Thus, there are physically 8,704 bit lines in the data array per word line. The number of bits that may be read at one time may be less than the width of the word line. For example, the data bus may be 128 bits wide. Accordingly, when reading or writing data, up to 128 bits are accessed at once. Each of the data bits is serviced by a Write Driver. The Write Drivers are distributed across the shadow of the array. Each column plane services 8 bits of the data burst and as such 8 Write Drivers are placed so as to cover the space occupied by the column plane. Bit lines that are physically close together are not enabled at the same time. Thus, instead of writing 128 adjacent physical memory values, a smaller number of bits in each column plane (e.g., one column) are written by selecting one of the sixty-four columns. For example, if column plane 0 is being written, then the first eight bits in each of the sixteen data blocks is written (along with a corresponding ECC byte in the ECC data block).

Setting data values in sense amplifiers in preparation for writing a background pattern to a memory array may comprise writing data values to a currently selected column and iterating over a plurality of columns as the currently selected column. For example, each of the 1,024 columns may be sequentially selected. As another example, each of the 64 column planes may be sequentially selected and data written simultaneously (e.g., 1 column×16 column planes×8 bits per column=128 bits at a time) to a corresponding column in each column plane.

In some example embodiments, after the data values are set in the array sense amplifiers, a column select signal is turned off so that all columns are selected. Iterating over the word lines then copies all data values from the sense amplifiers to the memory cells of the current word line simultaneously. The column select signal is kept off during the copying of the data values in the sense amplifiers to the memory cells.

Figure 6:
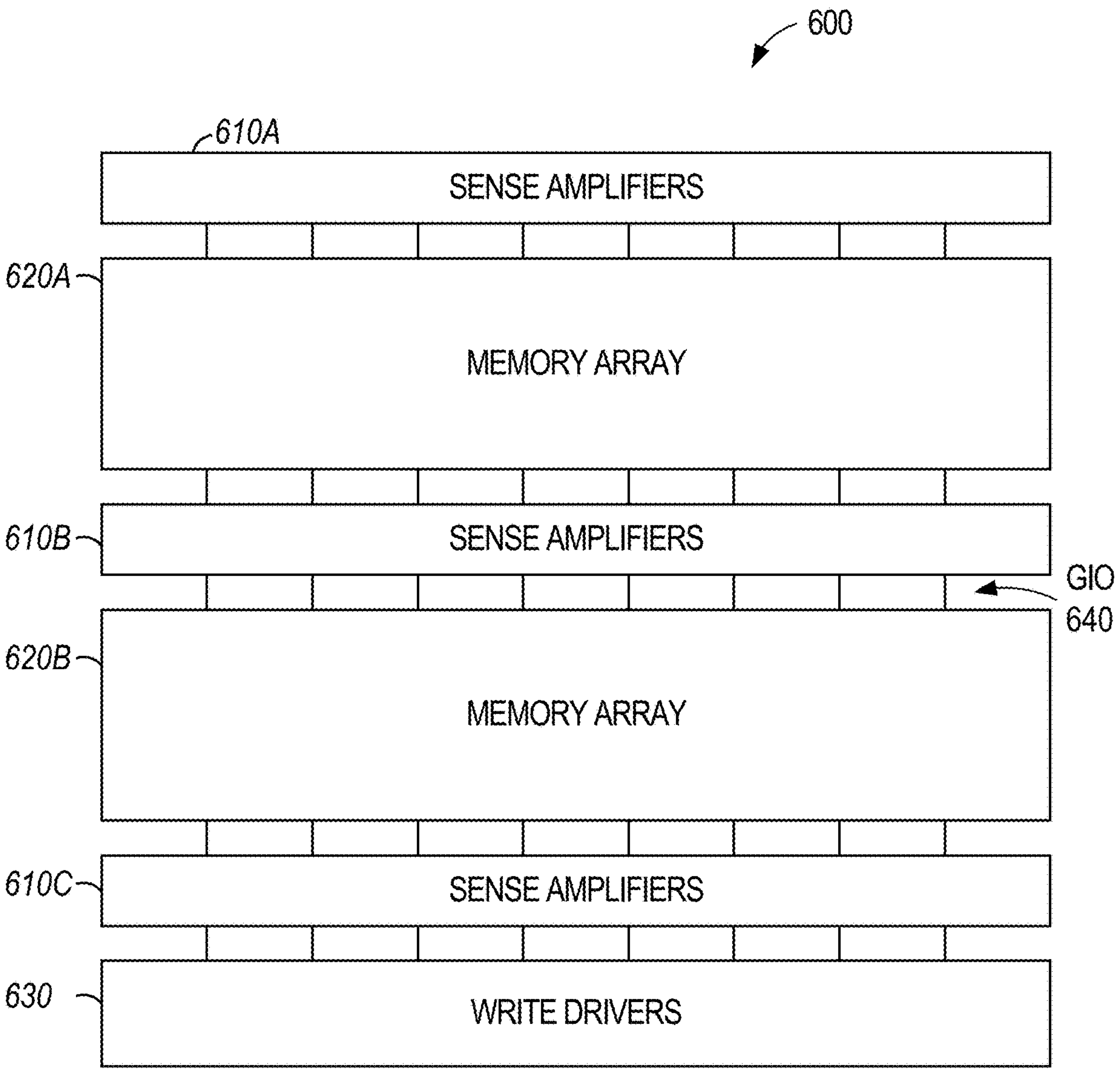
FIG. 6 is a schematic diagram showing the relation between write drivers, sense amplifiers, and memory arrays in a memory device, according to some example embodiments.

FIG. 6 is a schematic diagram 600 showing the relation between write drivers 630, sense amplifiers 610A, 610B, and 610C, and memory arrays 620A and 620B in a memory device, according to some example embodiments. The write drivers 630, sense amplifiers 610A-610C, and memory arrays 620A-620B are coupled by global input/output (GIO) lines 640. For illustration purposes, a limited number of components are shown, but any number of the components may be present. For example, any number of memory arrays 620 and sense amplifiers 610 may be alternated to support larger memory devices.

Data to be loaded into the memory array 620A or 620B is staged in the write drivers 630. The sense amplifiers corresponding to the memory array being written to are forced to the desired high or low voltage state by the write drivers 630. Odd digits in the memory arrays 620A-620B may be connected to one of sense amplifiers 610A-610C while even digits are connected to another one of sense amplifiers 610A-610C. For example, half of the digits of the memory array 620A may be connected to sense amplifiers 610A while the other half of the digits are connected to sense amplifiers 610B. Thus, when writing data to one or more rows of the memory array 620A, both sense amplifiers 610A and 610B are driven by the write drivers 630 to the desired voltages. Sense amplifiers 610C are not used unless the memory array 620B is being accessed.

When a word line in the memory array 620A is activated, data is transferred from the sense amplifiers 610A and 610B to the memory cells in the word line via the GIO lines 640. By activating multiple word lines simultaneously or sequentially, the same data may be transferred to the memory cells of all of the word lines without refreshing the data in the write drivers 630 or repeating the step of forcing the sense amplifiers 610A-610B to the corresponding voltages. Thus, the memory cells of the memory array 620A can be set to a background pattern much faster than by using ordinary write commands to write data to multiple physical memory addresses.

Figure 7:
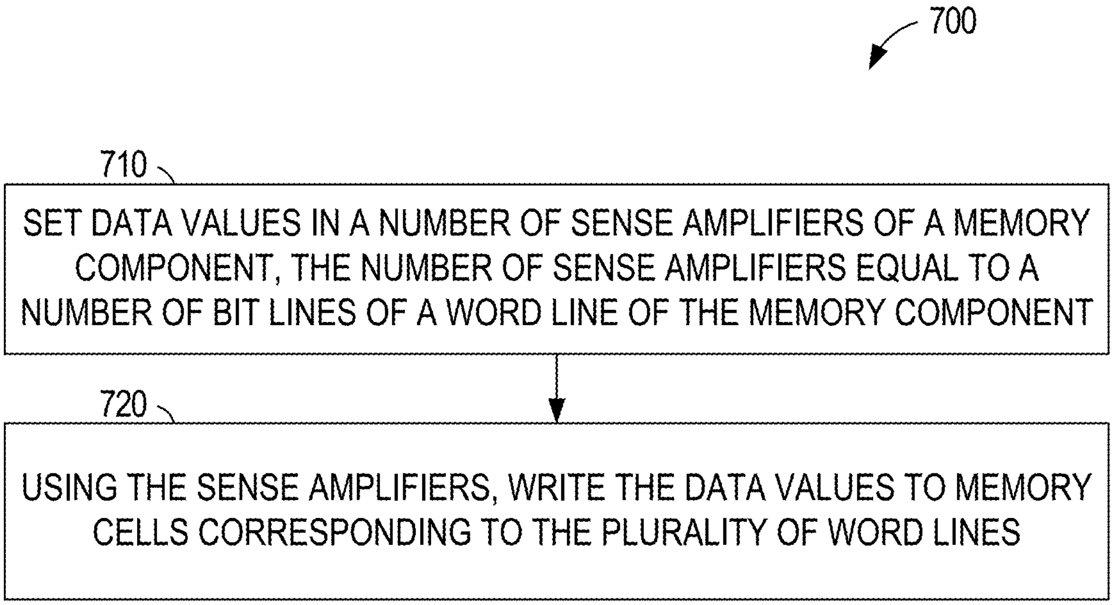
FIG. 7 is a flow diagram of an example method for quickly writing background array patterns, in accordance with some embodiments of the present disclosure.

FIG. 7 is a flow diagram of an example method 700 for quickly writing background array patterns, in accordance with some embodiments of the present disclosure. The method 700 includes operations 710 and 720. By way of example and not limitation, the method 700 is described as being performed by the memory device 230 of FIG. 2 described by the block diagram of FIG. 4. The method 700 may be initiated in response to receiving an initialize operation 285 from the program control 260, as shown in FIG. 2.

In operation 710, the I/O circuit 426 sets data values in a number of sense amplifiers of a word line in a memory component, the number of sense amplifiers equal to a number of bit lines of the word line in the memory component. For example, each sub-block 402$A_0$-402$A_n$ may be a separate memory component, each block 402A-402B may be a memory component, or the memory array 402 may be a memory component. The word line in the memory component may have 1,024 bit lines, 1,088 bit lines, 2,056 bit lines, 2,176 bit lines, 8,192 bit lines, 8,704 bit lines, or another number of bit lines. The data values set in the sense amplifiers may be a repeating pattern of a smaller number of bits. For example, a 32-bit value may be received on the I/O lines 408 and repeated 32 times to set the values for 1,024 bit lines, or a 128-bit value may be received on the I/O lines 408 and repeated 16 times to set the values for 8,192 bit lines. Some of the bit lines may hold ECC values that are determined based on the values on the other bit lines. For example, the number of bit lines may comprise a first number of data bit lines (e.g., 8,192) and a second number of error correction code (ECC) bit lines (e.g., 512).

The setting of the data values in the number of sense amplifiers may comprise setting data values in a first row of sense amplifiers (e.g., the sense amplifiers 610A of FIG. 6) that writes or receives data from odd-numbered bit lines in a portion of the memory component (e.g., the memory array 620A of FIG. 6) and a second row of sense amplifiers (e.g., the sense amplifiers 610B of FIG. 6) that writes or receives data from even-numbered bit lines in the portion of the memory component.

The controller 240 can write the pattern to each column on a single word line using write commands. The write commands are handled normally, causing any corresponding ECC data to be updated. After the data is written to the word line, the sense amplifiers will retain the data.

The data values are written to memory cells corresponding to a plurality of word lines, using the sense amplifiers, in operation 720. For example, multiple access lines 406 may be simultaneously or sequentially activated, causing the memory cells 404 of the activated access lines 406 to be programmed with data provided on the bit lines 410 by the sense amplifiers 420. Since multiple word lines are written with the same data, the writing of the data can be performed at a rate limited only by the hardware of the memory device 400 and not at a rate limited by the rate of inter-device communication on the I/O lines 408.

In some example embodiments, the programming of the memory cells with the data values from the sense amplifiers comprises iterating over the plurality of word lines as a current word line and, in each iteration, copying the data values from the number of sense amplifiers to memory cells corresponding to the current word line. In other example embodiments, the copying of the data values from the sense amplifiers to the memory cells comprises simultaneously activating the plurality of word lines.

To better illustrate the methods and apparatuses described herein, such as can be used for rapidly and efficiently patterning arrays of memory cells, a non-limiting set of Example embodiments are set forth below as numerically identified Examples.

Example 1 is a memory system comprising: a memory component comprising a number of bit lines, a plurality of word lines, and a number of sense amplifiers equal to the number of bit lines; and a processing device programmed to perform operations comprising: setting data values in the number of sense amplifiers; and using the sense amplifiers, writing the data values to memory cells corresponding to the plurality of word lines.

In Example 2, the subject matter of Example 1, wherein the writing of the data values to the memory cells corresponding to the plurality of word lines comprises: iterating over the plurality of word lines as a current word line; and in each iteration, copying the data values from the number of sense amplifiers to memory cells corresponding to the current word line.

In Example 3, the subject matter of Examples 1-2, wherein the writing of the data values to the memory cells corresponding to the plurality of word lines comprises: simultaneously activating the plurality of word lines.

In Example 4, the subject matter of Examples 1-3, wherein: the number of bit lines comprise a first number of data bit lines and a second number of error correction code (ECC) bit lines.

In Example 5, the subject matter of Examples 1-4 includes a first row of sense amplifiers that receives data from odd-numbered bit lines in a portion of the memory component; and a second row of sense amplifiers that receives data from even-numbered bit lines in the portion of the memory component.

In Example 6, the subject matter of Examples 1-5, wherein the setting of the data values in the number of sense amplifiers comprises: writing data values to a currently selected column; and iterating over a plurality of columns as the currently selected column.

In Example 7, the subject matter of Example 6, wherein the operations further comprise: after setting the data values in the number of sense amplifiers: turning off a column select signal and keeping the column select signal off during the writing of the data values to the memory cells.

In Example 8, the subject matter of Examples 6-7, wherein the writing of the data values to the currently selected column comprises: writing data to the currently selected column in each of a plurality of column planes.

In Example 9, the subject matter of Example 8, wherein the writing of the data to the currently selected column in each of the plurality of column planes comprises writing eight bits of the data to the currently selected column in each of sixteen column planes.

Example 10 is a method comprising: setting data values in a number of sense amplifiers of a memory component, the number of sense amplifiers equal to a number of bit lines of the word line of the memory component; and using the sense amplifiers, writing the data values to memory cells corresponding to a plurality of word lines of the memory component.

In Example 11, the subject matter of Example 10, wherein the writing of the data values to the memory cells corresponding to the plurality of word lines comprises: iterating over the plurality of word lines as a current word line; and in each iteration, copying the data values from the number of sense amplifiers to memory cells corresponding to the current word line.

In Example 12, the subject matter of Examples 10-11, wherein the writing of the data values to the memory cells corresponding to the plurality of word lines comprises: simultaneously activating the plurality of word lines.

In Example 13, the subject matter of Examples 10-12, wherein: the number of bit lines comprise a first number of data bit lines and a second number of error correction code (ECC) bit lines.

In Example 14, the subject matter of Examples 10-13, wherein the setting of the data values in the number of sense amplifiers comprises: writing data values to a currently selected column; and iterating over a plurality of columns as the currently selected column.

In Example 15, the subject matter of Example 14 includes, after setting the data values in the number of sense amplifiers: turning off a column select signal and keeping the column select signal off during the writing of the data values to the memory cells.

In Example 16, the subject matter of Examples 14-15, wherein the writing of the data values to the currently selected column comprises: writing data to the currently selected column in each of a plurality of column planes.

In Example 17, the subject matter of Example 16, wherein the writing of the data to the currently selected column in each of the plurality of column planes comprises writing eight bits of the data to the currently selected column in each of sixteen column planes.

Example 18 is a non-transitory machine-readable storage medium comprising instructions that, when executed by a processing device, cause the processing device to perform operations comprising: setting data values in a number of sense amplifiers of a memory component, the number of sense amplifiers equal to a number of bit lines of a word line of the memory component; and using the sense amplifiers, writing the data values to memory cells corresponding to a plurality of word lines of the memory component.

In Example 19, the subject matter of Example 18 includes, wherein the writing of the data values to the memory cells corresponding to the plurality of word lines comprises: iterating over the plurality of word lines as a current word line; and in each iteration, copying the data values from the number of sense amplifiers to memory cells corresponding to the current word line.

In Example 20, the subject matter of Examples 18-19 includes, wherein the writing of the data values to the memory cells corresponding to the plurality of word lines comprises: simultaneously activating the plurality of word lines.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

Each of these non-limiting Examples can stand on its own, or can be combined in various permutations or combinations with one or more of the other examples.

Figure 8:
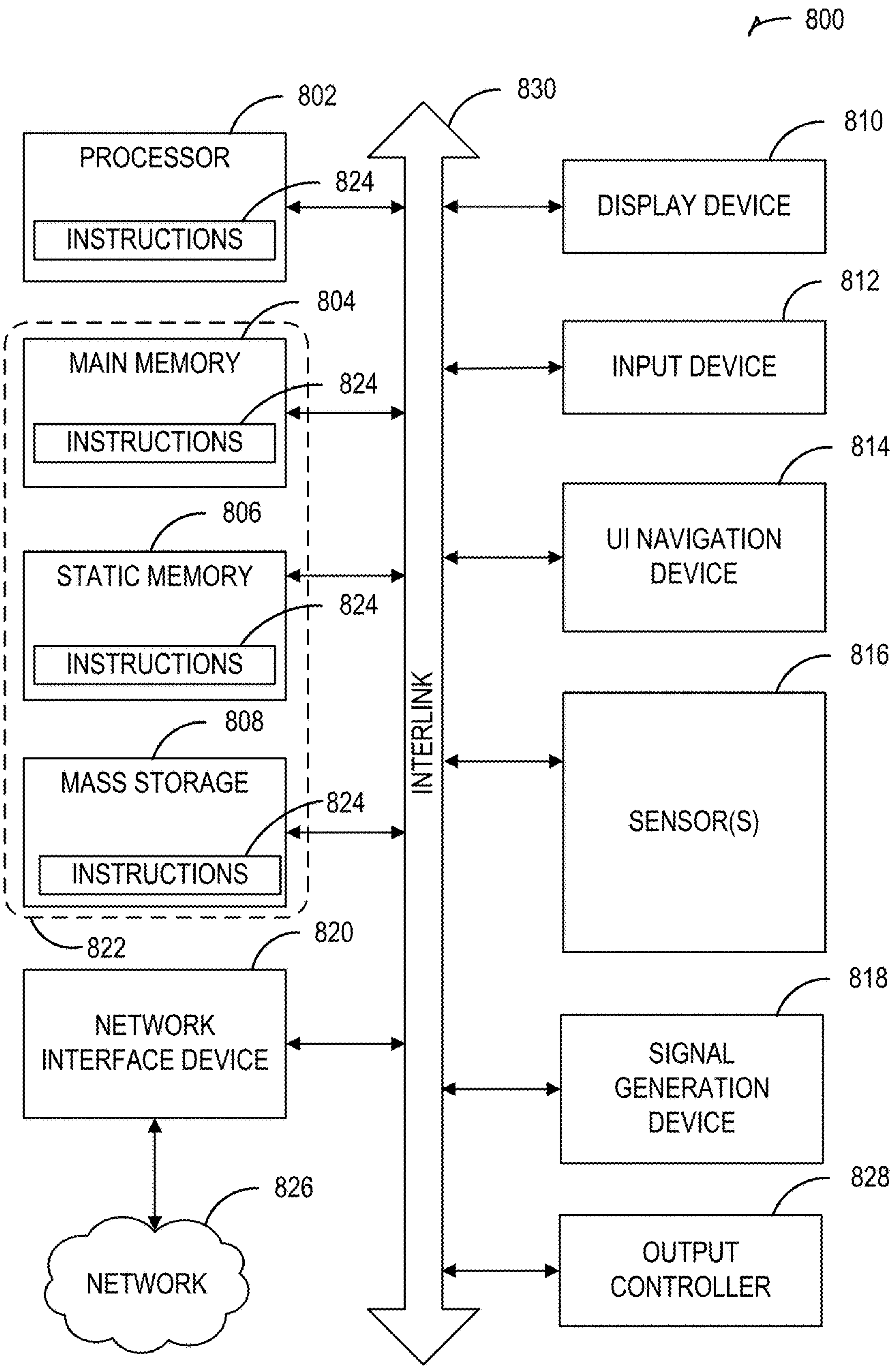
FIG. 8 is a block diagram of an example computer system in which embodiments of the present disclosure may operate.

FIG. 8 illustrates an example machine of a machine 800 within which a set of instructions can be executed for causing the machine to perform any one or more of the methodologies discussed herein. In some embodiments, the machine 800 can correspond to a host system that includes, is coupled to, or utilizes a memory sub-system (e.g., the memory sub-system 200 of FIG. 2) or can be used to perform the operations of a controller (e.g., to execute an operating system to execute instructions 824 to perform an initialize operation 285 of FIG. 2, described the example method 700 of FIG. 7). In an example, the controller can include memory to store offset voltage adjustments for memory components. The instructions 824 may include, for example, instructions 824 and/or logic described herein. In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

Examples, as described herein, can include, or can operate by, logic or a number of components, or mechanisms in the machine 800. Circuitry (e.g., processing circuitry) is a collection of circuits implemented in tangible entities of the machine 800 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 800.

In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be a PC, a tablet PC, a STB, a PDA, a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 800 (e.g., computer system) can include a hardware processor 802 (e.g., a central processing unit (CPU), a graphics processing unit (GPU), a hardware processor core, or any combination thereof), a main memory 804, a static memory 806 (e.g., memory or storage for firmware, microcode, a basic-input-output (BIOS), unified extensible firmware interface (UEFI), etc.), and mass storage device 808 (e.g., hard drives, tape drives, flash storage, or other block devices) some or all of which can communicate with each other via an interlink 830 (e.g., bus). The machine 800 can further include a display device 810, an alphanumeric input device 812 (e.g., a keyboard), and a user interface (UI) navigation device 814 (e.g., a mouse). In an example, the display device 810, the input device 812, and the UI navigation device 814 can be a touch screen display. The machine 800 can additionally include a signal generation device 818 (e.g., a speaker), a network interface device 820, and one or more sensor(s) 816, such as a global positioning system (GPS) sensor, compass, accelerometer, or other sensor. The machine 800 can include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 802, the main memory 804, the static memory 806, or the mass storage device 808 can be, or include, a machine-readable media 822 on which is stored one or more sets of data structures or instructions 824 (e.g., software) embodying or used by any one or more of the techniques or functions described herein. The instructions 824 can also reside, completely or at least partially, within any of registers of the hardware processor 802, the main memory 804, the static memory 806, or the mass storage device 808 during execution thereof by the machine 800. In an example, one or any combination of the hardware processor 802, the main memory 804, the static memory 806, or the mass storage device 808 can constitute the machine-readable media 822. While the machine-readable media 822 is illustrated as a single medium, the term "machine-readable medium" can include a single medium or multiple media (e.g., a centralized or distributed database, or associated caches and servers) configured to store the one or more instructions 824.

The term "machine-readable medium" can include any medium that is capable of storing, encoding, or carrying instructions for execution by the machine 800 and that cause the machine 800 to perform any one or more of the techniques of the present disclosure, or that is capable of storing, encoding, or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media can include: non-volatile memory, such as semiconductor memory sub-systems (e.g., electrically programmable read-only memory (EPROM), electrically erasable programmable read-only memory (EEPROM)) and flash memory sub-systems; magnetic disks, such as internal hard disks and removable disks; magneto-optical disks; and CD-ROM and DVD-ROM disks.

In an example, information stored or otherwise provided on the machine-readable media 822 can be representative of the instructions 824, such as instructions 824 themselves or a format from which the instructions 824 can be derived. This format from which the instructions 824 can be derived can include source code, encoded instructions (e.g., in compressed or encrypted form), packaged instructions (e.g., split into multiple packages), or the like. The information representative of the instructions 824 in the machine-readable media 822 can be processed by processing circuitry into the instructions to implement any of the operations discussed herein. For example, deriving the instructions 824 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 824.

In an example, the derivation of the instructions 824 can include assembly, compilation, or interpretation of the information (e.g., by the processing circuitry) to create the instructions 824 from some intermediate or preprocessed format provided by the machine-readable media 822. The information, when provided in multiple parts, can be combined, unpacked, and modified to create the instructions 824. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, compiled, or interpreted (e.g., into a library, stand-alone executable etc.) at a local machine, and executed by the local machine.

The instructions 824 can be further transmitted or received over a communications network 826 using a transmission medium via the network interface device 820 utilizing any one of a number of transfer protocols (e.g., frame relay, internet protocol, transmission control protocol (TCP), user datagram protocol (UDP), hypertext transfer protocol (HTTP), etc.). Example communication networks can include a LAN, a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, P2P networks, among others. In an example, the network interface device 820 can include one or more physical jacks (e.g., Ethernet, coaxial, or phone jacks) or one or more antennas to connect to the network 826. In an example, the network interface device 820 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine-readable medium.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, etc.

In the foregoing specification, embodiments of the disclosure have been described with reference to specific example embodiments thereof. The specification and drawings are, accordingly, to be regarded in an illustrative sense rather than a restrictive sense.

What is claimed is:

1. A memory system comprising:

a memory component comprising a number of bit lines, a plurality of word lines, and a number of sense amplifiers equal to the number of bit lines; and a processing device programmed to perform operations comprising:

setting data values in the number of sense amplifiers, the data values comprising a predetermined background pattern for initializing the memory component; and using the sense amplifiers, simultaneously writing the data values to memory cells corresponding to the plurality of word lines by simultaneously activating the plurality of word lines.

2. The memory system of claim 1, wherein:

the number of bit lines comprise a first number of data bit lines and a second number of error correction code (ECC) bit lines.

3. The memory system of claim 1, further comprising:

a first row of sense amplifiers that receives data from odd-numbered bit lines in a portion of the memory component; and a second row of sense amplifiers that receives data from even-numbered bit lines in the portion of the memory component.

4. A method comprising:

setting data values in a number of sense amplifiers of a memory component, the number of sense amplifiers equal to a number of bit lines of a word line of the memory component, the data values comprising a predetermined background pattern for initializing the memory component; and using the sense amplifiers, simultaneously writing the data values to memory cells corresponding to a plurality of word lines by simultaneously activating the plurality of word lines.

5. The method of claim 4, wherein:

the number of bit lines comprise a first number of data bit lines and a second number of error correction code (ECC) bit lines.

6. A non-transitory machine-readable storage medium comprising instructions that, when executed by a processing device, cause the processing device to perform operations comprising:

setting data values in a number of sense amplifiers of a memory component, the number of sense amplifiers equal to a number of bit lines of a word line of the memory component, the data values comprising a predetermined background pattern for initializing the memory component; and using the sense amplifiers, simultaneously writing the data values to memory cells corresponding to a plurality of word lines by simultaneously activating the plurality of word lines.

7. The memory system of claim 1, wherein the operations further comprise: prior to simultaneously activating the plurality of word lines, pre-charging the plurality of word lines simultaneously.

8. The memory system of claim 1, wherein the predetermined background pattern comprises all logical zero values.

9. The memory system of claim 1, wherein the setting of the data values in the number of sense amplifiers comprises: receiving a repeating pattern having fewer bits than the number of bit lines; and replicating the repeating pattern across the number of sense amplifiers to set the data values.

10. The memory system of claim 9, wherein the repeating pattern comprises 32 bits and is replicated 32 times.

11. The memory system of claim 1, wherein the operations are performed in response to receiving a single command to write the data values to the plurality of word lines.

12. The memory system of claim 1, wherein the operations are performed as part of a security scrubbing operation to clear data from previously used memory locations.

13. The memory system of claim 1, wherein the operations further comprise: maintaining the data values in the number of sense amplifiers throughout the simultaneous writing to the plurality of word lines without refreshing the data values from an external source.

14. The memory system of claim 1, wherein the operations are performed as part of a memory initialization operation during device startup.

15. The method of claim 4, wherein the predetermined background pattern is a repeating pattern that comprises 32 bits and is replicated 32 times.

16. The method of claim 4, further comprising: prior to simultaneously activating the plurality of word lines, pre-charging the plurality of word lines simultaneously.

17. The method of claim 4, wherein the predetermined background pattern comprises all logical zero values.

18. The method of claim 4, wherein the setting of the data values in the number of sense amplifiers comprises: receiving a repeating pattern having fewer bits than the number of bit lines; and replicating the repeating pattern across the number of sense amplifiers to set the data values.

19. The method of claim 4, wherein the writing of the data values to the memory cells corresponding to the plurality of word lines comprises:

simultaneously activating the plurality of word lines.

* * * * *